United States Patent
Zhang et al.

(10) Patent No.: US 12,267,100 B2
(45) Date of Patent: Apr. 1, 2025

(54) HETERO-INTEGRATED TERAHERTZ LOW-NOISE MINIATURIZED IMAGE FREQUENCY REJECTION TRANSCEIVER FRONT-END

(71) Applicant: University of Electronic Science and Technology of China, Sichuan (CN)

(72) Inventors: Bo Zhang, Sichuan (CN); Zhongqian Niu, Sichuan (CN); Xiaobo Yang, Sichuan (CN); Bingli Dai, Sichuan (CN); Yi Hu, Sichuan (CN); Jicong Zhang, Sichuan (CN); Yong Fan, Sichuan (CN); Ke Liu, Sichuan (CN); Zhi Chen, Sichuan (CN)

(73) Assignee: University of Electronic Science and Technology of China, Chengdu (CN)

( * ) Notice: Subject to any disclaimer, the term of this patent is extended or adjusted under 35 U.S.C. 154(b) by 424 days.

(21) Appl. No.: 17/877,896

(22) Filed: Jul. 30, 2022

(65) Prior Publication Data
US 2023/0238998 A1    Jul. 27, 2023

(30) Foreign Application Priority Data

Jan. 24, 2022  (CN) .......................... 202210082402.5

(51) Int. Cl.
*H04B 1/40* (2015.01)
*H03D 7/16* (2006.01)

(52) U.S. Cl.
CPC .............. *H04B 1/40* (2013.01); *H03D 7/165* (2013.01)

(58) Field of Classification Search
CPC .......... H03D 7/165; H03D 7/166; H04B 1/40; H04B 1/44
See application file for complete search history.

(56) References Cited

U.S. PATENT DOCUMENTS

| 5,517,687 A | * | 5/1996 | Niehenke | H04B 1/26 455/325 |
| 2007/0111697 A1 | * | 5/2007 | Bellantoni | H04B 1/30 455/324 |
| 2016/0006098 A1 | * | 1/2016 | Hasegawa | H01P 5/16 455/286 |

OTHER PUBLICATIONS

Bertrand Thomas et al., A 320-360 GHz Subharmonically Pumped Image Rejection Mixer Using Planar Schottky Diodes, IEEE Microwave and Wireless Components Letters, Feb. 2009, pp. 101-103, vol. 19 (2) (Year: 2009).*

(Continued)

*Primary Examiner* — Patrick C Chen (57) ABSTRACT

The present disclosure provides a hetero-integrated terahertz low-noise miniaturized image frequency rejection transceiver front-end, including an intermediate frequency circuit and a terahertz circuit arranged up and down, where the terahertz circuit includes a local oscillator frequency tripler, a 135° 3 dB filter coupler, a radio frequency waveguide power divider, and two quartz hetero-integrated subharmonic mixers; resonant cavities of an input unit, a first output unit, an isolation unit, and a second output unit of the 135° 3 dB filter coupler are sequentially coupled through resonant grooves to form a ring structure, a cavity length of the resonant cavity of the input unit is twice that of the resonant cavities of the other three units, and an electrical length of a waveguide of the first output unit is 45° different from that of a waveguide of the second output unit.

8 Claims, 6 Drawing Sheets

(56) References Cited

OTHER PUBLICATIONS

Bertrand Thomas et al., A 320-360 GHz Subharmonically Pumped Image Rejection Mixer Using Planar Schottky Diodes, IEEE Microwave and Wireless Components Letters, Feb. 2009, pp. 101-103, vol. 19 (2).

* cited by examiner

HETERO-INTEGRATED TERAHERTZ LOW-NOISE MINIATURIZED IMAGE FREQUENCY REJECTION TRANSCEIVER FRONT-END

CROSS REFERENCE TO RELATED APPLICATIONS

This application claims priority to Chinese Patent Application No. 202210082402.5 filed on Jan. 24, 2022, the disclosure of which is incorporated herein by reference in its entirety.

FIELD

The present disclosure relates to the technical field of terahertz wireless communication in general, and particularly to a hetero-integrated terahertz low-noise miniaturized image frequency rejection transceiver front-end.

BACKGROUND

Terahertz waves are electromagnetic waves at a frequency in a range of 0.1-10 THz, have a spectrum between millimeter waves and infrared light waves, and have both the characteristics of microwaves and light waves and unique characteristics. This makes terahertz technology an important extension of the electronics and photonics research. Due to the characteristics of moderate beam width, great bandwidth, and high confidentiality of the terahertz waves, the application prospect of the terahertz waves in the field of high-speed wireless communication has attracted widespread attention worldwide. Researches on new systems and methods for terahertz high-speed communication urgently need to be carried out, and terahertz integrated transceiver front-end technology is one of cores of the researches.

At present, terahertz solid-state high-speed communication system transceiver front-ends that have been reported have some problems, such as poor noise performance, low circuit integration, and weak image frequency rejection capability. The poor noise performance is mainly caused by the fact that a local oscillator drive source of a transceiver front-end mixer adopts a multiple frequency multiplication method, and the number of frequency multiplications is often greater than ten, which greatly deteriorates the noise performance. The size of a terahertz circuit is small, and if circuits are simply integrated, although the volume of the system can be reduced to achieve portability, reduction in the volume increases the difficulty of processing, mutual interference between the circuits also increases, and therefore a reasonable circuit architecture is very important. In addition, because a terahertz circuit is quite precise, and manual assembly may introduce uncertain manual assembly errors, which leads to deterioration of circuit performance. Moreover, when a plurality of circuits are required, manual assembly cannot guarantee circuit consistency. In the image frequency rejection transceiver front-end, performance inconsistency of two mixers may greatly reduce the image frequency rejection capability of the transceiver front-end.

The terahertz image frequency rejection receiving front-end has been reported abroad [B. Thomas, S. Rea, B. Moyna, et al. A 320-360 GHz subharmonically pumped image rejection mixer using planar Schottky diodes [J]. IEEE Microwave and Wireless Components Letters, 2009, 19 (2): 101-103]], which, however, has poor image frequency rejection due to an incomplete circuit architecture. Compared with the conventional structure, the present disclosure provides a novel image frequency rejection transceiver front-end architecture, to implement low-noise miniaturization.

SUMMARY

In view of the above-mentioned problems in the prior art, the present disclosure provides a hetero-integrated terahertz low-noise miniaturized image frequency rejection transceiver front-end, which uses a ring 135° 3 dB filter coupler, to reduce a circuit size while implementing low-noise image frequency rejection.

The specific technical solutions of the present disclosure are as follows.

Provided is hetero-integrated terahertz low-noise miniaturized image frequency rejection transceiver front-end, including an intermediate frequency circuit and a terahertz circuit arranged up and down, where the terahertz circuit includes a local oscillator frequency tripler, a 135° 3 dB filter coupler, a first quartz hetero-integrated subharmonic mixer, a second quartz hetero-integrated subharmonic mixer, and a radio frequency waveguide power divider; the 135° 3 dB filter coupler includes an input unit, a first output unit, a second output unit, and an isolation unit each of which is composed of a resonant cavity and a waveguide, and the resonant cavities of the input unit, the first output unit, the isolation unit, and the second output unit are sequentially coupled through resonant grooves to form a ring structure; a cavity length of the resonant cavity of the input unit is twice that of the resonant cavities of the other three units, and an electrical length of the waveguide of the first output unit is 45° different from that of the waveguide of the second output unit, so that a phase of an output signal of the first output unit is 135° different from that of second output unit.

A radio frequency signal is divided by the radio frequency waveguide power divider into two signals, which respectively enter the first quartz hetero-integrated subharmonic mixer and the second quartz hetero-integrated subharmonic mixer; a local oscillator signal is tripled by the local oscillator frequency tripler, then filtered and coupled by the 135° 3 dB filter coupler into two local oscillator drive signals, which respectively enter the first quartz hetero-integrated subharmonic mixer and the second quartz hetero-integrated subharmonic mixer to drive frequency mixing; and intermediate frequency components generated after the frequency mixing by the first quartz hetero-integrated subharmonic mixer and the second quartz hetero-integrated subharmonic mixer are respectively inputted to the intermediate frequency circuit, 90° coupled and amplified, to output an Upper Side Band (USB) signal and a Lower Side Band (LSB) signal, thereby implementing an image frequency rejection function.

Further, the intermediate frequency circuit and the terahertz circuit are connected by a first low-loss probe and a second low-loss probe.

Further, the waveguide of the input unit is connected to a ¼ section of the corresponding resonant cavity.

Further, the waveguides of the first output unit, the isolation unit, and the second output unit each are connected to a ½ section of the corresponding resonant cavity.

Further, the intermediate frequency circuit includes an intermediate frequency 90° bridge and an intermediate frequency low-noise amplifier arranged in sequence, and the intermediate frequency components generated after the frequency mixing by the first quartz hetero-integrated subharmonic mixer and the second quartz hetero-integrated subharmonic mixer are coupled by the intermediate frequency 90° bridge, and amplified by the intermediate frequency low-noise amplifier, to generate the Upper Side Band (USB) signal and the Lower Side Band (LSB) signal.

Further, the first quartz hetero-integrated subharmonic mixer and the second quartz hetero-integrated subharmonic mixer each are formed by assembling a diode in a mixer circuit by using a quartz suppression integration technology, thereby ensuring performance consistency of two mixer circuits.

Further, the first quartz hetero-integrated subharmonic mixer and the second quartz hetero-integrated subharmonic mixer each include a radio frequency waveguide-suspended microstrip line transition, a radio frequency matching circuit, an anti-parallel diode pair, a local oscillator matching circuit, a local oscillator low-pass filter, a local oscillator waveguide-suspended microstrip line transition, an intermediate frequency low-pass filter, and an intermediate frequency output port arranged in sequence.

Further, the local oscillator frequency tripler includes an input waveguide, an input waveguide-microstrip line transition, an input low-pass filter, an input matching circuit, a same-directional-parallel diode pair, an output matching circuit, an output waveguide-microstrip line transition, and an output waveguide arranged in sequence.

Further, the radio frequency waveguide power divider uses a Y-junction power divider circuit structure.

The working principle of the hetero-integrated terahertz low-noise miniaturized image frequency rejection transceiver front-end specifically includes: A radio frequency signal is divided by a radio frequency waveguide power divider into two signals with same power and a same phase, which then respectively enter a first quartz hetero-integrated subharmonic mixer and a second quartz hetero-integrated subharmonic mixer; a local oscillator signal is tripled by a local oscillator frequency tripler, and then inputted to a 135° 3 dB filter coupler for filtering and coupling into two local oscillator drive signals with same power and a phase difference of 135°, which respectively enter the first quartz hetero-integrated subharmonic mixer and the second quartz hetero-integrated subharmonic mixer to drive frequency mixing, to generate two intermediate frequency components with a phase difference of 270°(−90°), which are respectively inputted to an intermediate frequency circuit on an upper layer for 90° coupling and amplification; local oscillator noises having a phase difference of 270° (−90°) fed from the 135° 3 dB filter coupler into the first quartz hetero-integrated subharmonic mixer and the second quartz hetero-integrated subharmonic mixer are phase-changed by 90° by the intermediate frequency circuit, to then have a phase difference of 0°, to satisfy requirements of an image frequency rejection architecture, thereby outputting an Upper Side Band (USB) signal and a Lower Side Band (LSB) signal.

Compared with the prior art, the present disclosure has the following beneficial effects.

1. The present disclosure provides a hetero-integrated terahertz low-noise miniaturized image frequency rejection transceiver front-end, which by using a ring structure 135° 3 dB filter coupler with both filtering and coupling functions, implements circuit miniaturization while solving the problem of deterioration of a noise base of a local oscillator source after a plurality of frequency multiplications, thereby obtaining a low-noise image frequency rejection transceiver front-end.

2. The present disclosure adopts a double-layer circuit layout method, where an intermediate frequency circuit is arranged on the upper layer of a terahertz circuit, and a probe structure is used to implement low-loss connection, so that the entire transceiver front-end is integrated in a 30 mm×20 mm×20 mm circuit cavity, thereby achieving integration and miniaturization of the entire circuit of the terahertz image frequency rejection transceiver front-end.

DETAILED DESCRIPTION

The technical solutions of the present disclosure will be described in detail below with reference to the accompanying drawings and embodiments.

Embodiment 1

Figure 1:
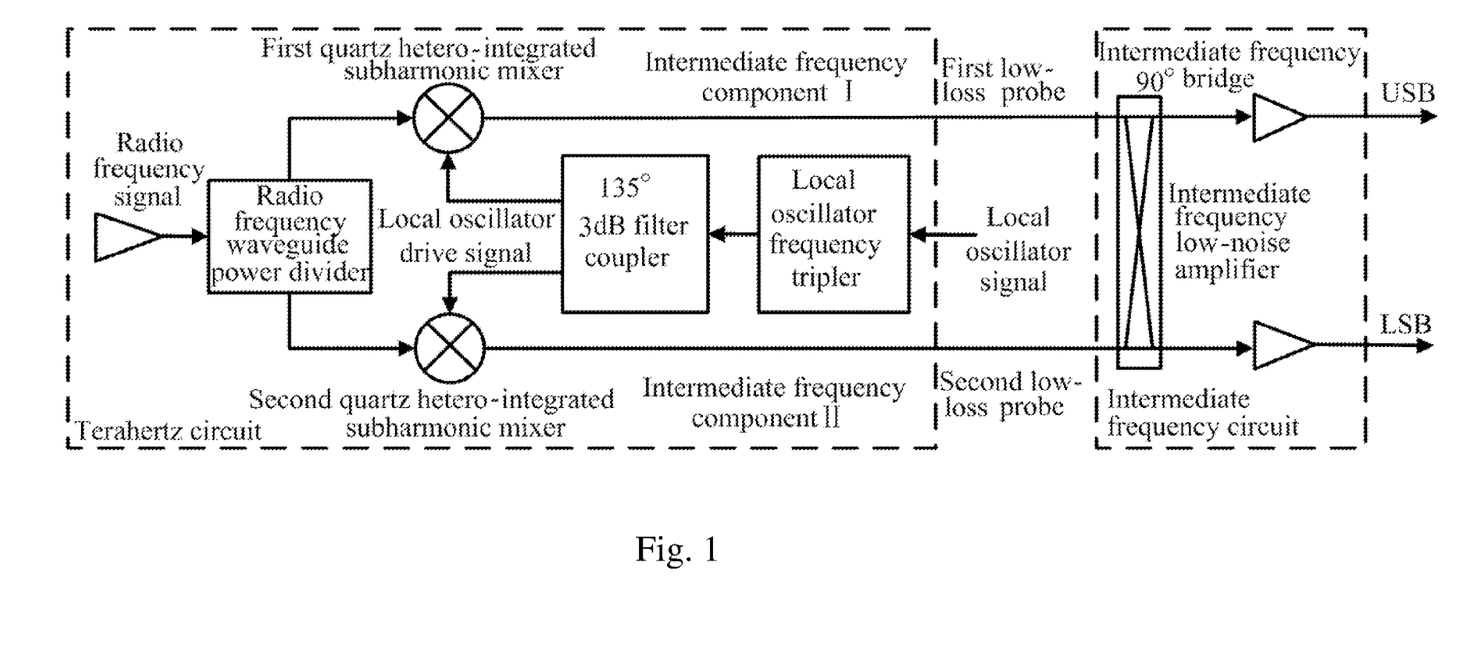
FIG. 1 is a schematic diagram of a circuit model of a hetero-integrated terahertz low-noise miniaturized image frequency rejection transceiver front-end according to Embodiment 1 of the present disclosure.

This embodiment provides a hetero-integrated terahertz low-noise miniaturized image frequency rejection transceiver front-end, as shown in FIG. 1, including a first low-loss probe, a second low-loss probe, an intermediate frequency circuit, and a terahertz circuit. The intermediate frequency circuit is arranged on an upper layer of the terahertz circuit, and the two circuits are connected by the first low-loss probe and the second low-loss probe, so that the terahertz low-noise miniaturized image frequency rejection transceiver front-end is entirely integrated in a 30 mm×20 mm×20 mm circuit cavity, thereby achieving miniaturization of the transceiver front-end while ensuring realizability of the circuit.

The terahertz circuit includes a local oscillator frequency tripler, a 135° 3 dB filter coupler, a first quartz hetero-integrated subharmonic mixer, a second quartz hetero-integrated subharmonic mixer, and a radio frequency waveguide power divider. The intermediate frequency circuit includes an intermediate frequency 90° bridge and an intermediate frequency low-noise amplifier arranged in sequence.

Figure 2:
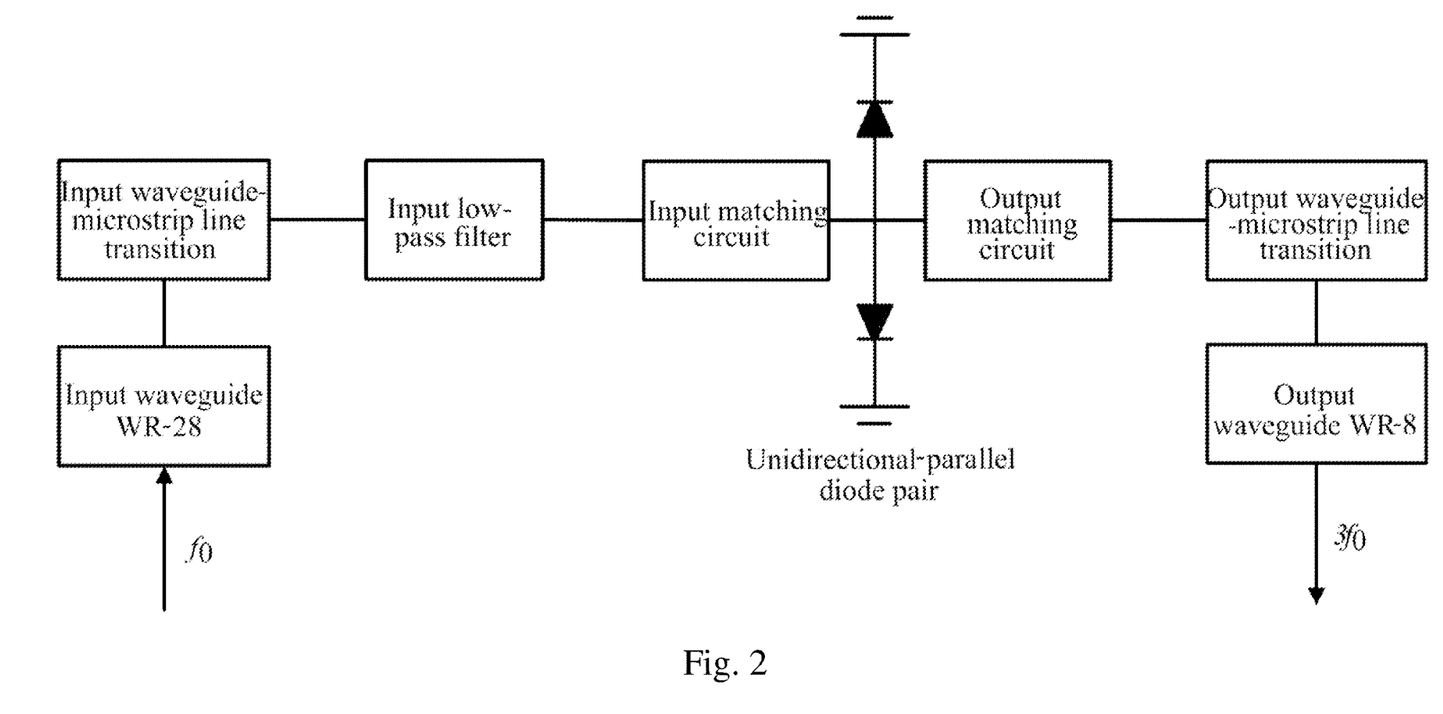
FIG. 2 is a schematic diagram of a circuit structure of a local oscillator frequency tripler according to Embodiment 1 of the present disclosure.

As shown in FIG. 2, the local oscillator frequency tripler includes an input waveguide WR-28, an input waveguide-microstrip line transition, an input low-pass filter, an input matching circuit, a same-directional-parallel diode pair, an output matching circuit, an output waveguide-microstrip line transition, and an output waveguide WR-8 arranged in sequence. A local oscillator signal at a frequency $f_0$ is inputted from the input waveguide WR-28 of the local oscillator frequency tripler, and then inputted, through the input waveguide-microstrip line transition, the input low-pass filter, and the input matching circuit, to the same-directional-parallel diode pair for frequency tripling, and the signal after the frequency tripling passes through the output matching circuit and the output waveguide-microstrip line transition, to output a local oscillator frequency tripled signal at a frequency $3f_0$ through the output waveguide WR-8. The input waveguide-microstrip line transition is a transition used for receiving the local oscillator signal though the input waveguide WR-28 and sending the local oscillator signal to the input low-pass filter, and the output waveguide-microstrip line transition is a transition used for connecting the 135° 3 dB filter coupler and the output matching circuit, where the output waveguide-microstrip line transition is connected to the 135° 3 dB filter coupler through the output waveguide WR-8. The input matching circuit and the output matching circuit are designed based on a load traction method, so that an input signal enters the same-directional-parallel diode pair with maximum energy to participate in frequency multiplication, and then is outputted with maximum energy after the frequency multiplication. For the incapability of the same-directional-parallel diode pair in suppressing an even-order harmonic component, waveguide reduction processing is performed on the output waveguide-microstrip line transition, so that a cut-off frequency of the output port of the output waveguide-microstrip line transition is increased, thereby effectively preventing leakage of a third harmonic component.

Figure 3:
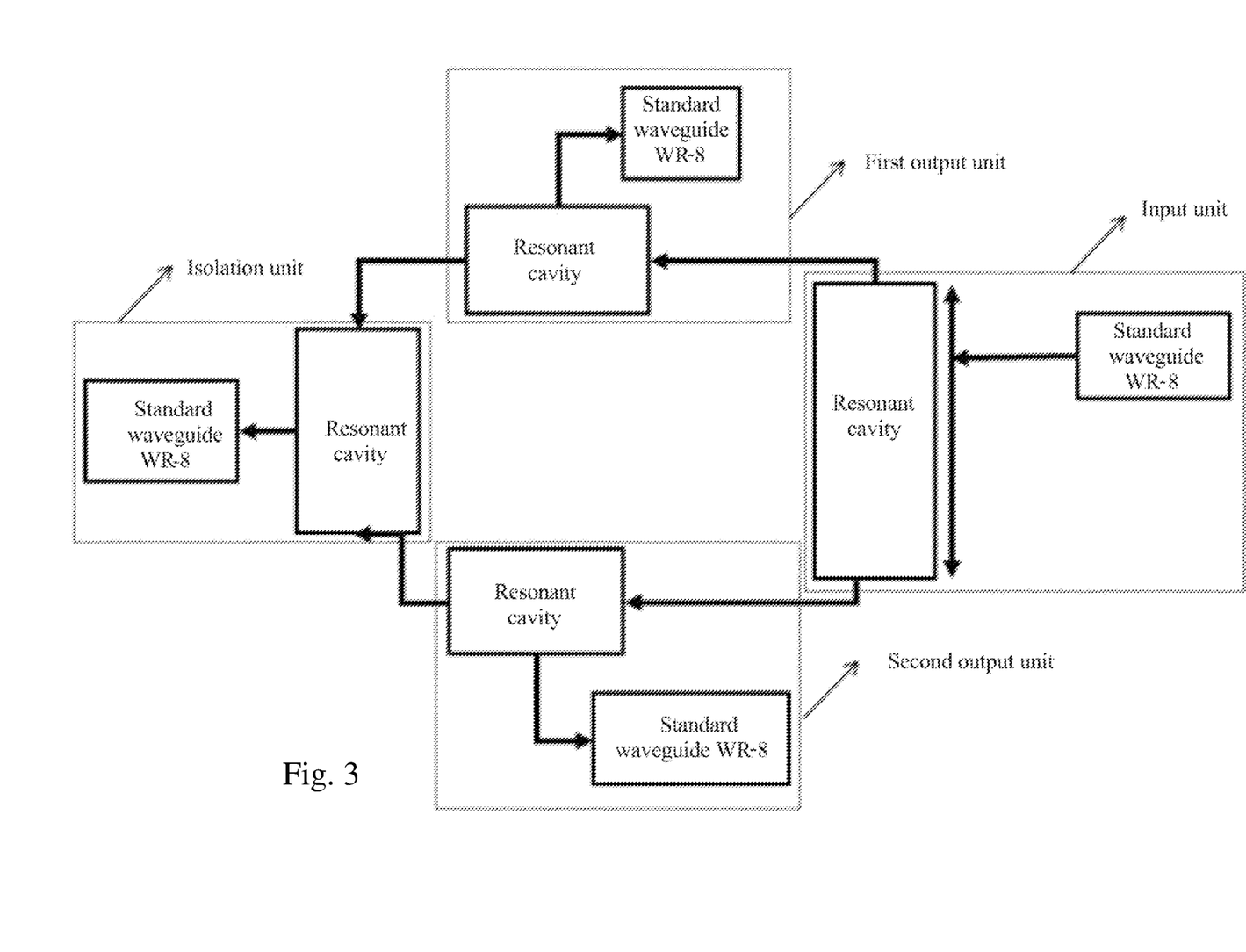
FIG. 3 is a schematic diagram of a structure of a 135° 3 dB filter coupler according to Embodiment 1 of the present disclosure.

As shown in FIG. 3, the 135° 3 dB filter coupler includes an input unit, a first output unit, a second output unit, and an isolation unit, each of which is composed of a resonant cavity and a standard waveguide WR-8, and the resonant cavities of the input unit, the first output unit, the isolation unit, and the second output unit are sequentially coupled through resonant grooves to form a ring structure. A cavity length of the resonant cavity of the input unit is twice of that of the resonant cavities of the first output unit, the second output unit, and the isolation unit. An electrical length of the standard waveguide WR-8 of the first output unit is 45° different from the standard waveguide WR-8 of the second output unit, so that a phase of an output signal of the first output unit is 135° different from that of the second output unit. A local oscillator frequency tripled signal enters from the standard waveguide WR-8 of the input unit, and is filtered and coupled into two local oscillator drive signals with same power and a phase difference of 135°, which are respectively outputted from the standard waveguides WR-8 of the first output unit and the second output unit, and in this case, anti-phase offset occurs at the isolation end due to a phase difference of 180°, and no signal is outputted therefrom.

Figure 4:
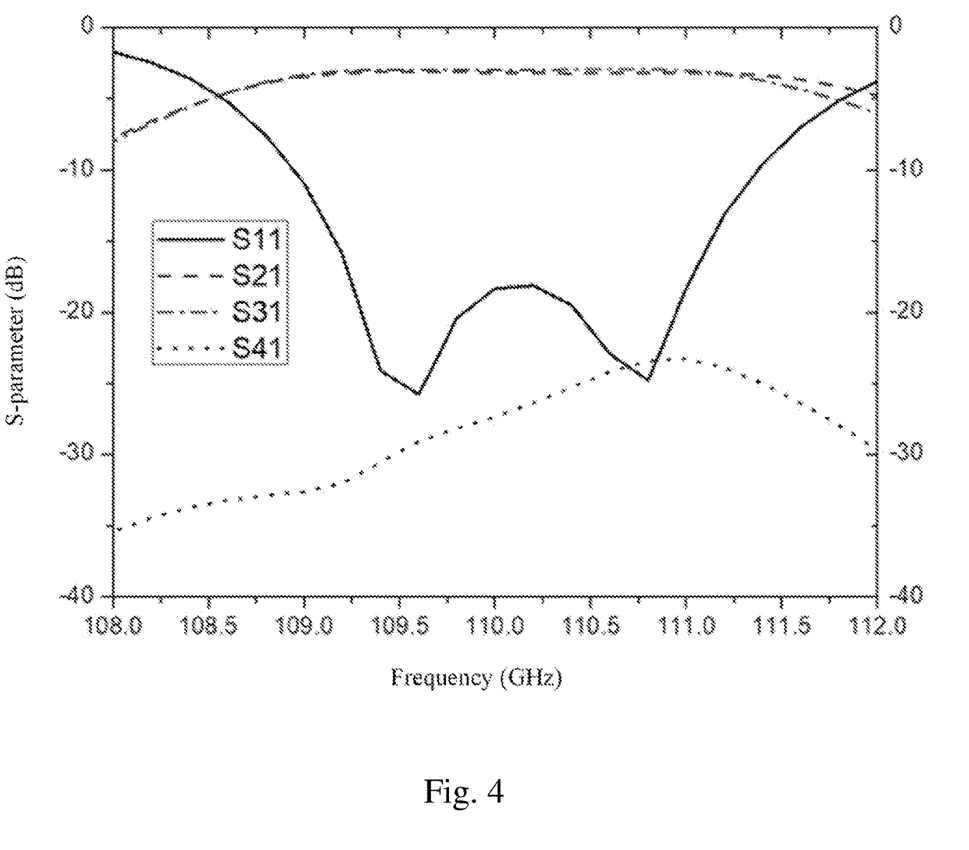
FIG. 4 illustrates a result of S-parameter simulation of the 135° 3 dB filter coupler according to Embodiment 1 of the present disclosure.
Figure 5:
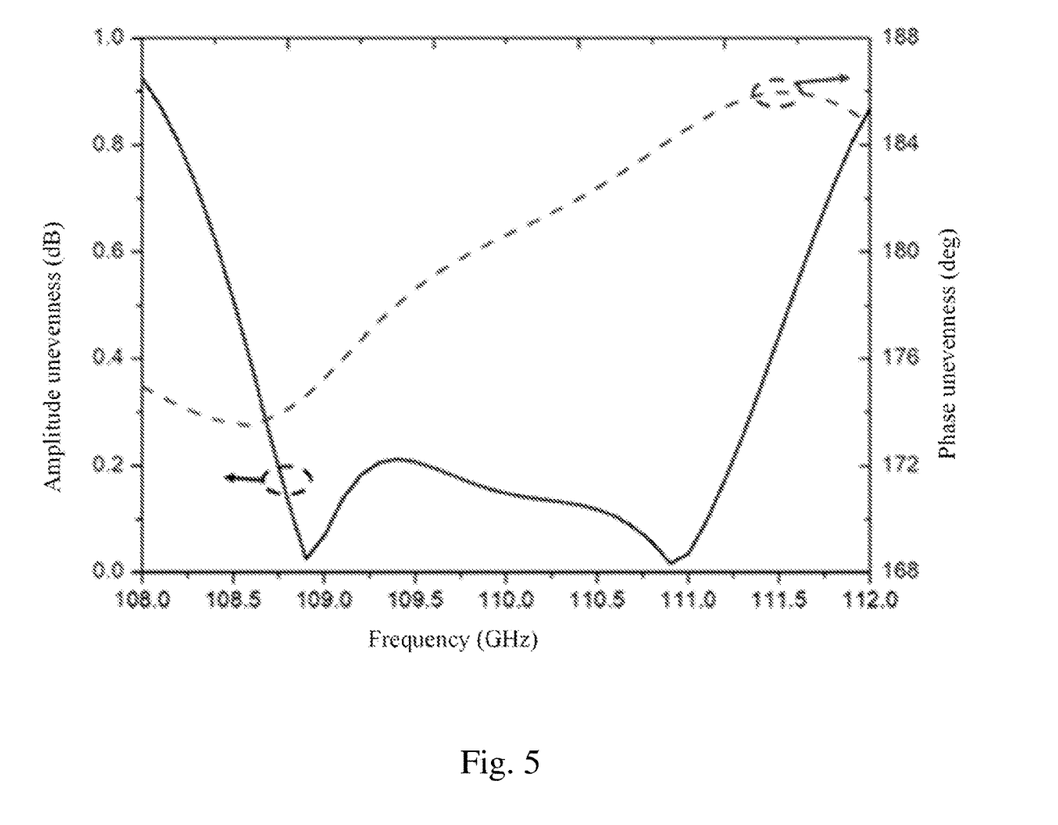
FIG. 5 illustrates a simulation result of phase unevenness and amplitude unevenness of the signal outputted by the 135° 3 dB filter coupler according to Embodiment 1 of the present disclosure.

A result of S-parameter simulation of the 135° 3 dB filter coupler is shown in FIG. 4, and it can be learned that at a frequency near a 110 GHz local oscillator frequency band, a return loss S11 is better than −20 dB. In combination with simulation results of phase unevenness and amplitude unevenness in FIG. 5, it can be learned that the amplitude unevenness of the two local oscillator drive signals outputted from the first output unit and the second output unit is lower than 0.2 dB, and compared with the phase difference of 180°, the phase unevenness is lower than 3°, which demonstrate excellent performance.

The radio frequency waveguide power divider uses a Y-junction power divider circuit structure. A radio frequency signal is inputted from a common end waveguide of the radio frequency waveguide power divider and outputted from two branch waveguides formed through bifurcation, so that the radio frequency signal is divided into two signals with same power and a same phase.

Figure 6:
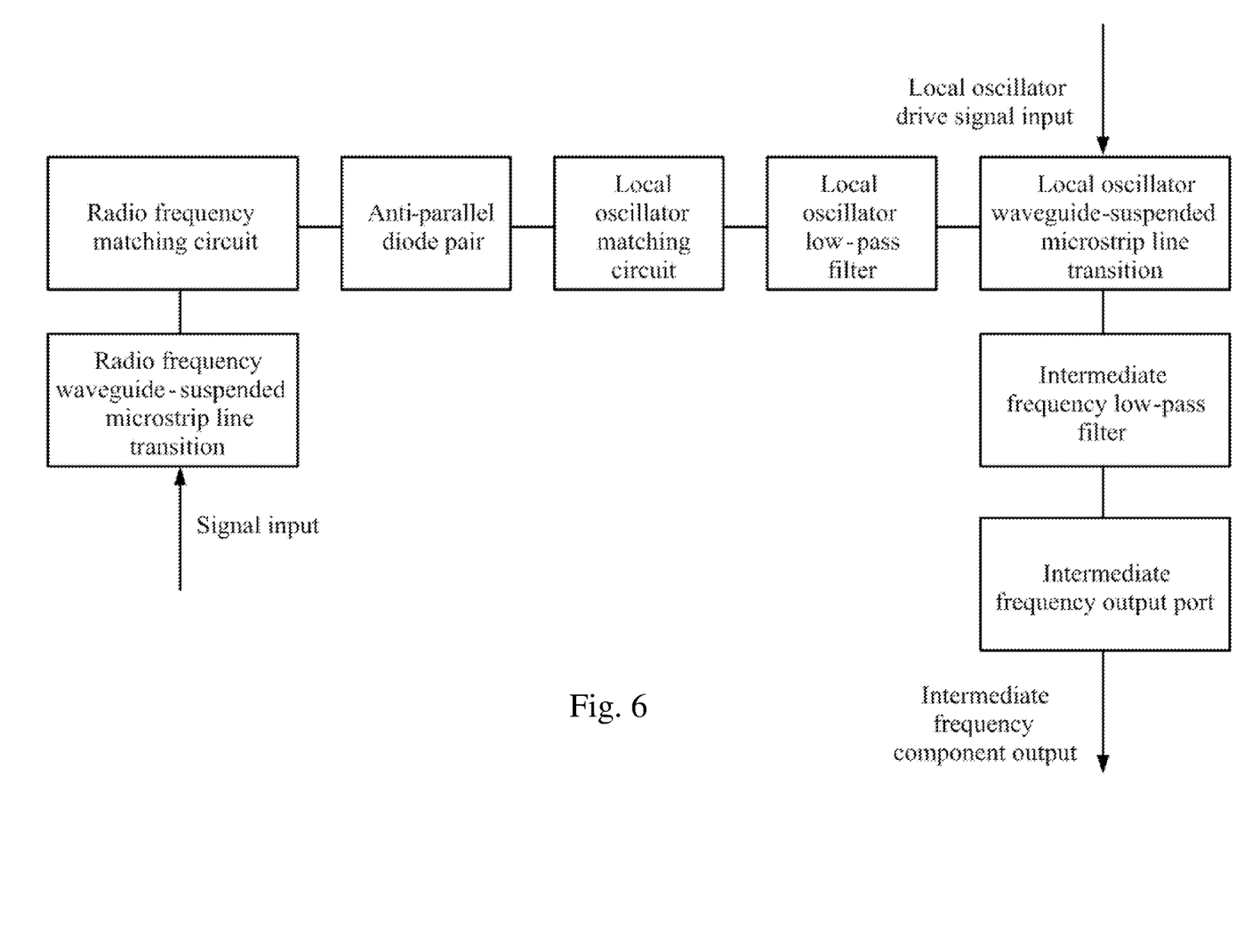
FIG. 6 is a schematic diagram of a circuit structure of a first quartz hetero-integrated subharmonic mixer and a second quartz hetero-integrated subharmonic mixer according to Embodiment 1 of the present disclosure.

As shown in FIG. 6, the first quartz hetero-integrated subharmonic mixer and the second quartz hetero-integrated subharmonic mixer are balanced circuit structures, each of which is formed by assembling a diode in a mixer circuit by using a quartz suppression integration technology, thereby ensuring performance consistency of two mixer circuits. The circuit includes a radio frequency waveguide-suspended microstrip line transition, a radio frequency matching circuit, an anti-parallel diode pair, a local oscillator circuit, a local oscillator low-pass filter, a local oscillator waveguide-suspended microstrip line transition, an intermediate frequency low-pass filter, and an intermediate frequency output port arranged in sequence. A signal outputted by the radio frequency waveguide power divider enters the radio frequency waveguide-suspended microstrip line transition, and passes through the radio frequency matching circuit, to enter the anti-parallel diode pair. A local oscillator drive signal outputted by the 135° 3 dB filter coupler enters the local oscillator waveguide-suspended microstrip line transition, and passes through the local oscillator low-pass filter and the local oscillator matching circuit, to enter the anti-parallel diode pair to drive frequency mixing. The radio frequency signal and the local oscillator drive signal are mixed in the anti-parallel diode pair, to produce intermediate frequency components, which then pass through the local oscillator matching circuit, the local oscillator low-pass filter, the local oscillator waveguide-suspended microstrip line transition, and the intermediate frequency low-pass filter, to be outputted from the intermediate frequency output port. The radio frequency waveguide-suspended microstrip line transition is a transition used for connecting the radio frequency waveguide power divider and the radio frequency matching circuit, receiving the radio frequency signal and sending the radio frequency signal to the frequency matching circuit; the local oscillator waveguide-suspended microstrip line transition is a transition used for connecting the 135° 3 dB filter coupler, the local oscillator low-pass filter and the intermediate frequency low-pass filter.

The working principle of the hetero-integrated terahertz low-noise miniaturized image frequency rejection transceiver front-end includes: A radio frequency signal is divided by a radio frequency waveguide power divider into two signals with same power and a same phase, which then respectively enter a first quartz hetero-integrated subharmonic mixer and a second quartz hetero-integrated subharmonic mixer; a local oscillator signal is tripled by a local oscillator frequency tripler, and then inputted to a 135° 3 dB filter coupler for filtering and coupling, which effectively reduces noise base after a plurality of frequency multiplications and further alleviates noise of the transceiver front-end, and two local oscillator drive signals with same power and a phase difference of 135° are outputted, which respectively enter the first quartz hetero-integrated subharmonic mixer and the second quartz hetero-integrated subharmonic mixer to drive frequency mixing, to generate two intermediate frequency components (respectively an intermediate frequency component 1 and an intermediate frequency component 2) with a phase difference of 270°(−90°), which are respectively inputted, through a first low-loss probe and a second low-loss probe, to an intermediate frequency 90° bridge of an intermediate frequency circuit on an upper layer for 90° coupling, and amplification by an intermediate frequency low-noise amplifier, to output an Upper Side Band (USB) signal and a Lower Side Band (LSB) signal; local oscillator noises having a phase difference of 270°(−

90°) fed from the 135° 3 dB filter coupler into the first quartz hetero-integrated subharmonic mixer and the second quartz hetero-integrated subharmonic mixer are phase-changed by 90° by the intermediate frequency circuit, to then have a phase difference of 0°, thereby satisfying requirements of an image frequency rejection architecture.

What is claimed is:

1. A hetero-integrated terahertz low-noise miniaturized image frequency rejection transceiver front-end, comprising an intermediate frequency circuit and a terahertz circuit arranged up and down, wherein the terahertz circuit comprises a local oscillator frequency tripler, a 135° 3 dB filter coupler, a first quartz hetero-integrated subharmonic mixer, a second quartz hetero-integrated subharmonic mixer, and a radio frequency waveguide power divider; the 135° 3 dB filter coupler comprises an input unit, a first output unit, a second output unit, and an isolation unit each of which is composed of a resonant cavity and a waveguide, and the resonant cavities of the input unit, the first output unit, the isolation unit, and the second output unit are sequentially coupled through resonant grooves to form a ring structure; a cavity length of the resonant cavity of the input unit is twice that of the resonant cavities of the other three units, and an electrical length of the waveguide of the first output unit is 45° different from that of the waveguide of the second output unit;

a radio frequency signal is divided by the radio frequency waveguide power divider into two signals, which respectively enter the first quartz hetero-integrated subharmonic mixer and the second quartz hetero-integrated subharmonic mixer; a local oscillator signal is tripled by the local oscillator frequency tripler, then filtered and coupled by the 135° 3 dB filter coupler into two local oscillator drive signals, which respectively enter the first quartz hetero-integrated subharmonic mixer and the second quartz hetero-integrated subharmonic mixer to drive frequency mixing; and intermediate frequency components generated after the frequency mixing by the first quartz hetero-integrated subharmonic mixer and the second quartz hetero-integrated subharmonic mixer are respectively inputted to the intermediate frequency circuit, 90° coupled and amplified, to output an upper side band (USB) signal and a lower side band (LSB) signal.

2. The hetero-integrated terahertz low-noise miniaturized image frequency rejection transceiver front-end according to claim 1, wherein the intermediate frequency circuit and the terahertz circuit are connected by a first low-loss probe and a second low-loss probe.

3. The hetero-integrated terahertz low-noise miniaturized image frequency rejection transceiver front-end according to claim 1, wherein the waveguide of the input unit is connected to a ¼ section of the resonant cavity.

4. The hetero-integrated terahertz low-noise miniaturized image frequency rejection transceiver front-end according to claim 1, wherein the waveguides of first output unit, the isolation unit, and the second output unit each are connected to a ½ section of the corresponding resonant cavity.

5. The hetero-integrated terahertz low-noise miniaturized image frequency rejection transceiver front-end according to claim 1, wherein the intermediate frequency circuit comprises an intermediate frequency 90° bridge and an intermediate frequency low-noise amplifier arranged in sequence, and the intermediate frequency components generated after the frequency mixing by the first quartz hetero-integrated subharmonic mixer and the second quartz hetero-integrated subharmonic mixer are coupled by the intermediate frequency 90° bridge, and amplified by the intermediate frequency low-noise amplifier, to generate the USB signal and the LSB signal.

6. The hetero-integrated terahertz low-noise miniaturized image frequency rejection transceiver front-end according to claim 1, wherein the first quartz hetero-integrated subharmonic mixer and the second quartz hetero-integrated subharmonic mixer each comprise a radio frequency waveguide-suspended microstrip line transition, a radio frequency matching circuit, an anti-parallel diode pair, a local oscillator matching circuit, a local oscillator low-pass filter, a local oscillator waveguide-suspended microstrip line transition, an intermediate frequency low-pass filter, and an intermediate frequency output port arranged in sequence.

7. The hetero-integrated terahertz low-noise miniaturized image frequency rejection transceiver front-end according to claim 1, wherein the local oscillator frequency tripler comprises an input waveguide, an input waveguide-microstrip line transition, an input low-pass filter, an input matching circuit, a same-directional-parallel diode pair, an output matching circuit, an output waveguide-microstrip line transition, and an output waveguide arranged in sequence.

8. The hetero-integrated terahertz low-noise miniaturized image frequency rejection transceiver front-end according to claim 1, wherein the radio frequency waveguide power divider uses a Y-junction power divider circuit structure.

* * * * *